(12) United States Patent
Spahn

(10) Patent No.: US 6,429,414 B1
(45) Date of Patent: Aug. 6, 2002

(54) SOLID STATE IMAGE DETECTOR AND METHOD FOR PRODUCING SAME

(75) Inventor: Martin Spahn, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/538,144

(22) Filed: Mar. 29, 2000

(30) Foreign Application Priority Data

Mar. 31, 1999 (DE) .......................................... 199 14 701

(51) Int. Cl.$^7$ ................................................ H01L 27/00
(52) U.S. Cl. ................................... 250/208.1; 250/216
(58) Field of Search .............................. 250/208.1, 216, 250/370.11, 370.09, 370.12; 348/272, 281, 294, 302; 257/290, 291, 440

(56) References Cited

U.S. PATENT DOCUMENTS 5,262,649 A  * 11/1993  Antonuk et al. ....... 250/370.09
5,381,014 A  *  1/1995  Jeromin et al. ........ 250/370.09
5,483,071 A      1/1996  Oikawa et al. ........ 250/370.09

FOREIGN PATENT DOCUMENTS

| DE | 195 24 858 | 1/1997 |
| EP | 0 903 590 | 3/1999 |

* cited by examiner

*Primary Examiner*—Que T. Le
(74) *Attorney, Agent, or Firm*—Schiff Hardin & Waite

(57) ABSTRACT

In a method for producing a solid state image detector, and a solid state image detector produced according to the method, a pixel matrix, made of a semiconductor material, particularly an amorphous silicon and a scintillator layer, for converting radiation incident on the scintillator layer so that it can be processed by the pixel matrix, is composed of a number of sub-detectors that are arranged side by side and that are referred to as panels, is coated with a passivation layer, and a layer that is transparent for the radiation emitted by the scintillator layer is deposited on the passivation layer, and the scintillator layer is vaporized on the layer thereafter.

22 Claims, 2 Drawing Sheets

SOLID STATE IMAGE DETECTOR AND METHOD FOR PRODUCING SAME

BACKGROUND OF THE INVENTION

1. Field of the Invention

The present invention is directed to a method for producing a solid state image detector, and a solid state image detector of the type formed by a pixel matrix that is coated with a passivation layer and that is made of a semiconductor material, particularly an amorphous silicon and a scintillator layer for purposes of converting radiation incident on the scintillator layer, so that it can be processed by the pixel matrix, the pixel matrix being composed of a number of sub-detectors that are arranged side by side and that are referred to as panels.

2. Description of the Prior Art

Solid state image detectors of the above type are known and are based on an active matrix (readout matrix) in the form of the pixel matrix made of a semiconductor material, amorphous silicon (a-Si), for example. In a radiographic converter, a scintillator layer (made of cesium iodide, for example) transforms the image information into a radiation that can be processed by the pixel matrix. The image information is stored as electrical charge in the active pixels of the pixel matrix and is subsequently read out in analog form and converted into digital form, with dedicated electronics. X-ray quanta are transformed into radiation in the scintillator layer, the transformation being into light in the case of cesium iodide which is coupled to the pixels of the amorphous silicon, the pixels being photo diodes. This optical process must be optimized in order to achieve a good image quality. Good coupling of the scintillator layer to the pixel matrix is important, since a poor coupling negatively influences the most important parameters that are relevant with respect to the image quality. These parameters are the resolution which, in the frequency domain is quantified by means of the MTF (modulation transfer function), and the frequency-dependent signal-to-noise transmission capability, which is described by DQE (detective quanta efficiency). In order to receive good values for these parameters, it is essential to bring the generated signal, namely the radiation generated by the scintillator, to the pixel matrix without any noteworthy attenuation (by loss processes and scattering processes) and without significant blurring of the location information (by scattering or refraction).

The best known method for the reception of signal information and location information is the direct vaporization of the pixel matrix, or the passivation layer with the scintillator layer fashioned on it. This is possible for solid state detectors that are composed of a single panel when specific temperature boundary conditions are maintained. Problems occur, however, if this technique is used for large-surface detectors that are comprised of a number of sub-detectors arranged side by side. Microscopically small fissures or cracks always arise at the butting edges of these sub-detectors, which immensely disturb the crystal growth of the scintillator layer and prevent a steady growth. Satisfactory signal transmission, and therefore satisfactory image quality cannot be achieved in the surrounding area of these butting edges. Therefore, heretofore a direct vaporization of such large-surface solid state image detectors has not been possible.

In order to still be able to deposit the scintillator on such a large-surface pixel matrix, the scintillator layer is initially vaporized on a substrate, normally a thin aluminum foil, and is subsequently glued to the sub-detectors of the solid state image detector with the scintillator layer directed toward the pixel matrix. The optical coupling properties are considerably impaired by this intervening adhesive so that MTF and DQE are worse compared to a direct process, particularly at higher spatial frequencies.

SUMMARY OF THE INVENTION

An object of the present invention is to provide a method that makes it possible to produce a large-surface solid state image detector with an improved optical coupling of the scintillator layer.

For solving this problem, in an inventive method of the type described, a layer which is transparent for the radiation emitted by the scintillator layer is deposited, on the passivation layer and the scintillator layer is subsequently vaporized on this deposited layer.

In the inventive method, a radiation-transparent layer is initially deposited on the passivation layer (silicon nitride, for example) of the pixel matrix that is composed of a number of adjacently arranged sub-detectors; an even (smooth) surface is also created in the region of the butt joints of the panel edges as a result. This makes is possible to directly vaporize the scintillator material on this layer as well as to have a homogenous scintillator layer grow in the region of the butt joints of the sub-detectors. Since the radiation-transparent layer is directly deposited on the passivation layer of the pixel matrix and since the scintillator layer is directly vaporized on this layer, extremely good optical coupling results.

In order to further improve the optical coupling, a layer, whose refraction index lies essentially midway between the respective refractive indices of the scintillator layer and the passivation layer or of the semiconductor material, can be inventively utilized. This keeps the refraction as low as possible in the coupling of the radiation generated by the scintillator layer into the radiation-transparent layer and the coupling of the radiation which penetrates this layer into the passivation layer or the semiconductor material.

In a first embodiment, a foil that is glued onto the passivation layer or that is adhesively fastened can be used as the transparent layer. An adhesive having a refractive index between the refractive indices of the foil and the passivation layer or the semiconductor material can be utilized. Since the adhesive layer also exhibits a specific thickness, a further improvement of the radiation coupling with regard to refraction can be achieved by suitable selection of the refraction index thereof. A foil that is formed by a number of foil layers that exhibit different refractive indices can be used.

The thickness of the foil should be as low as possible and should be within the range of a few $\mu$m. Since the scintillator is vaporized directly on the foil it will be exposed to the temperatures present during the vapor deposition, thus it should exhibit in the case of CsI a temperature stability up to at least 180° C., up to at least 250° C., in particular.

In an alternative inventive embodiment to fashioning the layer as a foil, the layer is formed by casting a viscous layer of material with a subsequent hardening or curing of same. The sub-detectors, are cast from the top side, so that a very even surface layer (on which the scintillator material can be vaporized) is produced. An adhesive can be utilized as the layer material, with the thickness of the layer should also be a few $\mu$m here. In the hardened condition, the utilized layer material should be stable up to at least 180° C., particularly up to 250°C.

Especially in the case of utilizing a foil, it has proven expedient, for reasons of stability, to at least partially fill the butt joints of the adjacent sub-detectors, which are arranged on a glass substrate, with a filling material before the layer is deposited. In the case of casting the layer, the butt joints, in any case, are filled with the layer material, so that a sufficient stability is derived therefrom.

In order to avoid radiation being laterally coupled into the semiconductor material, and therefore into the pixels at the borders via the butt joints, the filling material should not be transparent for the radiation emitted by the scintillator layer. An adhesive is also appropriate for this purpose. In the case of utilizing a foil and in the case of fashioning a casting layer, this filling material, particularly the adhesive, is previously introduced into the butt joints, then the foil is deposited or the layer material is cast out. The butt joints should be filled as completely as possible with the material that is not radiation-transparent. Thus, an unintended coupling of radiation emitted by the scintillator can be avoided, which would lead to information falsification in the edge area.

Apart from the method, the invention also is directed to a solid state image detector, formed as a pixel matrix that is coated with a passivation layer and that is made of a semiconductor material, particularly an amorphous silicon and a scintillator layer for converting radiation incident on the scintillator layer, so that it can be processed by the pixel matrix, the matrix being composed of a number of sub-detectors that are arranged side by side and that are referred to as panels, and having a layer, which covers the passivation layer and on which the scintillator layer is deposited, that is deposited on the passivation layer.

DESCRIPTION OF THE PREFERRED EMBODIMENTS

Figure 1:
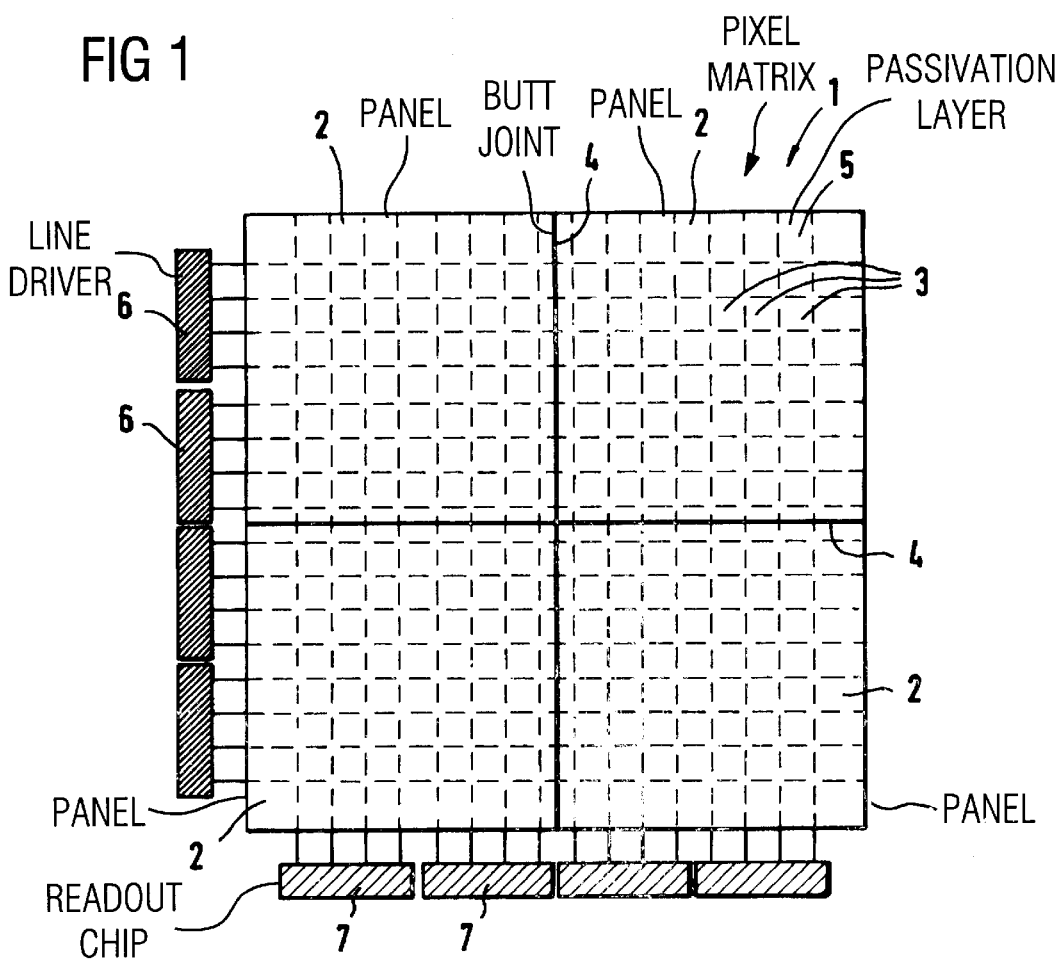
FIG. 1 is a plan view of an inventive solid state image detector that is formed by a number of individual panels.

In FIG. 1 shows the basic elements of an inventive solid state image detector 1 formed by four separate sub-detectors, referred to as panels 2, made of a semiconductor material. Each panel 2 is a pixel matrix that is composed of a number of individual pixels 3. The panels 2 are adjacently arranged at butt joints 4. The butt joints 4 are a few pm wide, their width is essentially dependent on the edge quality of the panel edges residing opposite to one another. Examinations have shown that joint widths within the range of 20–80 μm occur, sometimes even more. The panels 2 shown in FIG. 1 are arranged with their undersides on a common substrate in the form of a glass carrier. A passivation layer 5 (not shown in greater detail), which is made of silicon nitride, for example, is deposited on the active image surface, which is formed by the pixels 3. The scintillator layer is deposited on this passivation layer (described in the following). Further, FIG. 1 shows the line drivers 6 and the readout chips 7 of the drive electronics and readout electronics.

Figure 4:
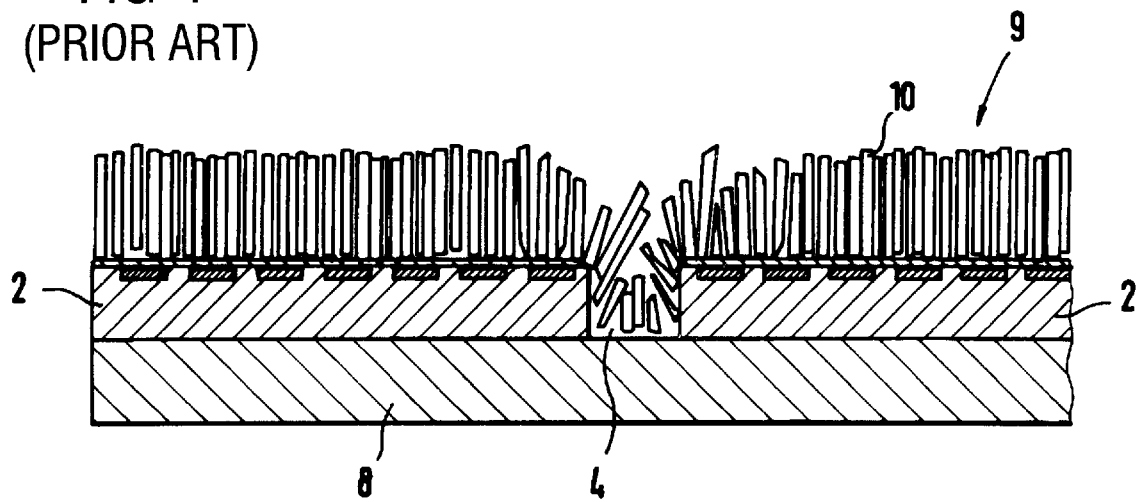
FIG. 4 is a sectional view through a solid state image detector for illustrating the configuration that results from a direct vaporization of the scintillator layer without introducing the inventive layer.

As described, scintillator layer is to be deposited on the panel arrangement shown in FIG. 1. FIG. 4 shows the problems that occur from the existing butt joints 4 when conventional adjacently arranged panels 2 are directly vaporized. The butt joint 4 is situated on the substrate 8 between the two panels 2. As FIG. 4 clearly shows, a disturbed crystal growth results when the scintillator layer 9, is grown on the passivation layer. The scintillator layer 9 is formed as needle-shaped cesium iodide crystals 10 in the present case. This leads to an unsatisfactory image quality in the area of each butt joint 4.

Figure 2:
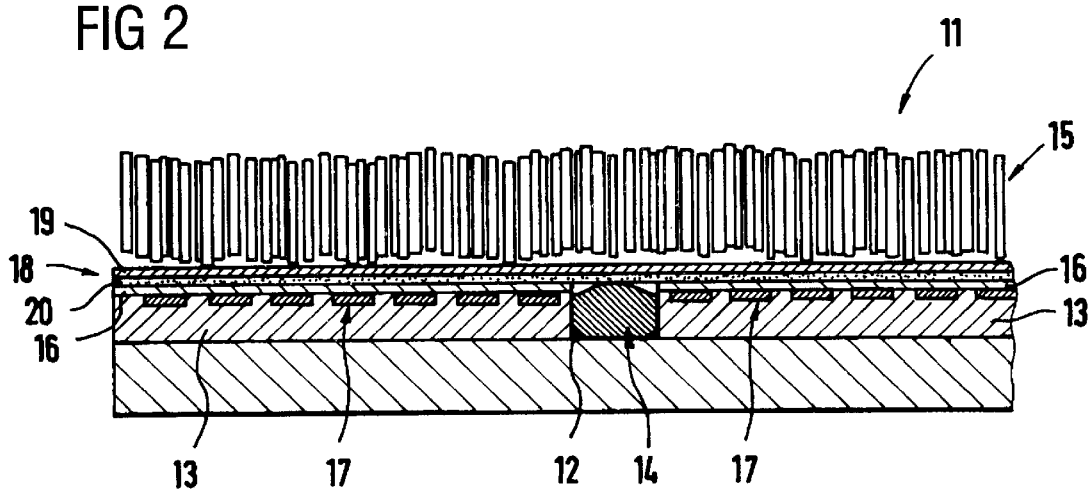
FIG. 2 is a schematic sectional view through the solid state image detector of FIG. 1 with a layer in the form of a foil.

FIG. 2 shows a section through an inventive solid state image detector 11. The butt joint 12 of the solid state image detector between the two panels 13 is filled by a filling material 14, in the form of an adhesive, for example. The filling material 14 is not transparent with respect to the radiation emitted by the scintillator 15, so that lateral coupling of radiation into the border areas of the panels 13 is avoided. In the exemplary embodiment, a layer 18 in the form of a foil 19 that is transparent for the radiation emitted by the scintillator layer 15 is deposited on the passivation layer 16, which covers the pixels 17 of the panels 13. The foil 19 covers the passivation layer 16 and the butt joint 12 and forms an even surface on which the scintillator layer 15 is directly vaporized. The fastening of the foil 19 ensues by means of an adhesive layer 20. The refraction index of the foil 19, and, if used, the refractive index of the adhesive layer 20, are selected corresponding to the refractive indices of the scintillator layer 15 and the passivation layer 16, and possibly the semiconductor material of the panels 13, for optimizing the radiation coupling from the scintillator layer 15 to the pixel matrixes 17.

Figure 3:
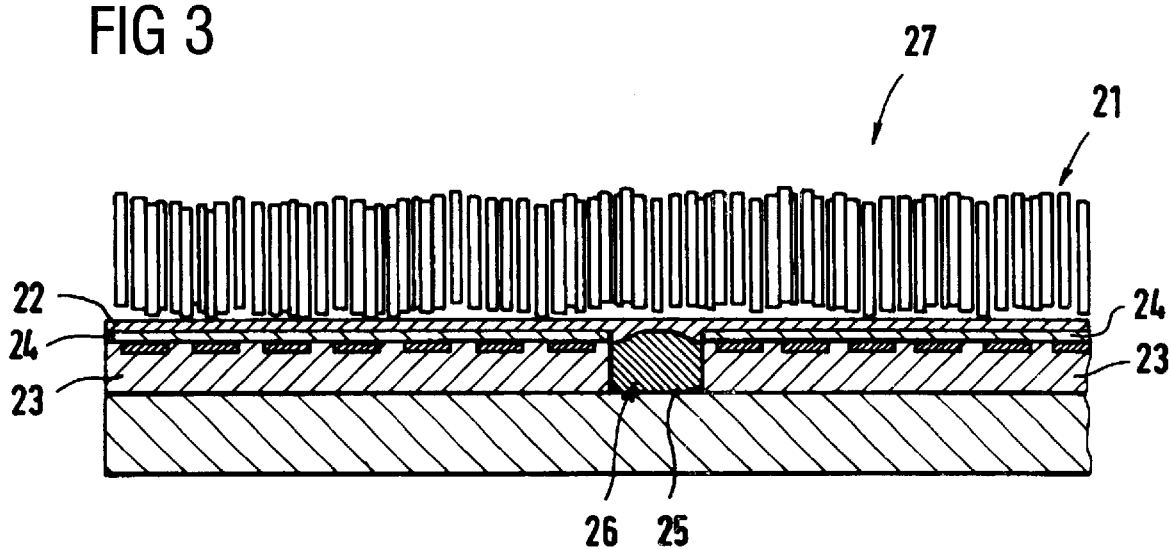
FIG. 3 is a view according to FIG. 2 with a layer generated by casting.

FIG. 3 shows a further embodiment of the invention. In the sectional view of a solid state image detector 21 shown therein, the layer 22 is formed by casting a viscous layer material on the panels 23 and by a subsequent hardening of the layer material, an adhesive preferably being utilized. The layer 22 homogeneously covers the passivation layers 24 of the panels 23 and it also fills in the butt joint 26, that is primarily filled with a non-transparent filling material 25. An even surface thus forms, on which the scintillator layer 27 can be vaporized.

The thicknesses of the layers 18 and 22 are a few pm. They are transparent to the radiation emitted by the scintillator and are stable at the temperatures that are utilized during the vaporization. The foil shown in FIG. 2 can be formed of a number of foil layers arranged successively on top of one another; each layer can exhibit a different refractive index in order to achieve an improvement of the optical coupling.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for producing a solid-state image detector, comprising the steps of:

abutting a plurality of panels side-by-side, each panel comprising a plurality of separated pixel detectors covered by a passivation layer, to form a pixel matrix having joints between said panels;

depositing a continuous layer, that is transparent to scintillator-emitted radiation, on said passivation layer and extending across said joints to form a continuous surface; and vaporizing a scintillator layer on said continuous surface, said scintillator layer converting incoming radiation incident thereon into said scintillator-emitted radiation.

2. The method of claim 1 wherein said scintillator layer has a refractive index and wherein said passivation layer has a refractive index, and selecting a material for said layer that is transparent to said scintillator-emitted radiation having a refractive index which is substantially midway between said refractive index of said scintillator layer and said refractive index of said passivation layer.

3. The method of claim 1 comprising applying a foil on said passivation layer as said layer which is transparent to said scintillator-emitted radiation.

4. The method of claim 3 comprising gluing said foil onto said passivation layer.

5. The method of claim 4 wherein said foil has a refractive index and wherein said passivation layer has a refractive index, and comprising gluing said foil to said passivation layer using an adhesive having a refractive index between said refractive index of said foil and said refractive index of said passivation layer.

6. The method of claim 3 comprising forming said foil from a plurality of foil layers with respectively different refractive indices.

7. The method of claim 3 comprising utilizing a foil having a thickness of a few $\mu$m.

8. The method of claim 3 comprising utilizing a foil that is stable up to at least 180° C.

9. The method of claim 8 comprising utilizing a foil that is stable up to at least 250° C.

10. The method of claim 1 comprising depositing said layer that is transparent to said scintillator-emitted radiation by casting a viscous material onto said passivation layer and subsequently curing said viscous material.

11. The method of claim 10 comprising utilizing an adhesive as said viscous material.

12. The method of claim 10 comprising forming said layer which is transparent to said scintillator-emitted radiation with a thickness of a few $\mu$m.

13. The method of claim 10 comprising utilizing a viscous material which is stable up to at least 180° C. after curing.

14. The method of claim 13 comprising utilizing a viscous material which is stable up to at least 250° C. after curing.

15. The method of claim 1 wherein said panels respectively have butt joints therebetween as said joints, and comprising utilizing a foil as said layer which is transparent to said scintillator-emitted radiation, and at least partially filling said butt joints with a filling material prior to applying said foil on said passivation layer.

16. The method of claim 15 comprising utilizing a material as said filling material which is not transparent to said scintillator-emitted radiation.

17. The method of claim 15 comprising utilizing an adhesive as said filling material.

18. A solid state image detector comprising:

a plurality of panels each containing a plurality of separated pixel detectors covered by a scintillation layer, forming a pixel matrix having joints between said panels;

a continuous layer, that is transparent to scintillator-emitted radiation, deposited on the passivation layer of the respective panels and extending across said joints forming a continuous surface; and a scintillator layer vaporized on said continuous surface, said scintillator layer converting incoming radiation incident thereon into said scintillator-emitted radiation.

19. A solid state image detector as claimed in claim 18 wherein said scintillator layer has a refractive index and said passivation layer has a refractive index, and wherein said layer which is transparent to said scintillator-emitted radiation has a refractive index which is substantially midway between said refractive index of said scintillator layer and said refractive index of said passivation layer.

20. A solid state image detector as claimed in claim 18 wherein said layer which is transparent to said scintillator-emitted radiation comprises a foil which is glued onto said continuous surface.

21. A solid state image detector as claimed in claim 18 wherein said foil has a refractive index and wherein said passivation layer has a refractive index, and wherein said foil is adhered to said continuous surface with an adhesive having a refractive index between said refractive index of said foil and said refractive index of said passivation layer.

22. A solid state image detector as claimed in claim 18 wherein said foil is comprised of a plurality of foil layers with respectively different refractive indices.

* * * * *